United States Patent [19]

Lee et al.

[11] Patent Number: 5,072,075
[45] Date of Patent: Dec. 10, 1991

[54] DOUBLE-SIDED HYBRID HIGH DENSITY CIRCUIT BOARD AND METHOD OF MAKING SAME

[75] Inventors: James C. K. Lee, Los Altos Hills; Arshad Ahmad, San Jose; Myrna E. Castro, Milpitas; Francisca Tung, Los Gatos, all of Calif.

[73] Assignee: Digital Equipment Corporation, Maynard, Mass.

[21] Appl. No.: 372,859

[22] Filed: Jun. 28, 1989

[51] Int. Cl.[5] .............................................. H05K 1/00
[52] U.S. Cl. ...................................... 174/264; 29/830; 29/846; 174/255; 361/414
[58] Field of Search ................. 174/68.5, 255, 264; 361/414; 29/829, 830, 831, 846; 333/238, 246

[56] References Cited

U.S. PATENT DOCUMENTS

| | | | |
|---|---|---|---|
| 3,934,335 | 1/1976 | Nelson | 174/266 X |
| 4,372,804 | 2/1983 | Hanabusa et al. | 29/831 X |
| 4,420,364 | 12/1983 | Nukii et al. | 174/257 X |
| 4,480,288 | 10/1984 | Gazdik et al. | 29/846 X |
| 4,522,667 | 6/1985 | Hanson et al. | 174/257 X |
| 4,566,186 | 1/1986 | Bauer et al. | 29/852 |
| 4,612,083 | 9/1986 | Yasumoto et al. | 156/633 |
| 4,640,866 | 2/1987 | Suzuki | 361/414 X |
| 4,679,122 | 7/1987 | Belke, Jr. et al. | 174/258 X |
| 4,689,110 | 8/1987 | Leibowitz | 156/634 |
| 4,710,854 | 12/1987 | Yamada et al. | 361/41 X |
| 4,754,371 | 6/1988 | Nitta et al. | 174/36 X |
| 4,755,911 | 6/1988 | Suzuki | 361/414 |
| 4,770,922 | 9/1988 | Hatakeyama et al. | 428/211 |
| 4,781,969 | 11/1988 | Kobayashi et al. | 174/52 FP X |
| 4,791,239 | 12/1988 | Shirahata et al. | 174/258 |
| 4,803,450 | 2/1989 | Burgess et al. | 361/414 X |
| 4,806,188 | 2/1989 | Rellick | 174/250 X |
| 4,811,082 | 3/1989 | Jacobs et al. | 174/261 X |
| 4,816,323 | 3/1989 | Inoue | 174/266 X |

*Primary Examiner*—Morris H. Nimmo
*Attorney, Agent, or Firm*—Flehr, Hohbach, Test, Albritton & Herbert

[57] ABSTRACT

A very fine line three-dimensional package is constructed without lamination during construction of the signal core. Construction of the signal core employs a method of line and hole formation and planarization without drilling, and avoids imposing excessive stress on the package during its assembly. In forming the three-dimensional structure, a power core which may comprise a single or multiple layers is manufactured in the conventional method using a very high dielectric constant material.

A signal core is on both sides of the power core, using a sequential approach with a low dielectric constant material. The method comprises utilizing photoresist techniques to define the regions of horizontal lines running parallel to the surface of the power core substrate and vertical posts running perpendicular to the surface of the power core, as each layer of lines and posts is established. After metallization of the lines and posts, the dielectric is flowed over the pattern of lines and posts to form a finished layer of the signal core. The sequence is repeated as many times as necessary to build up the required wiring pattern in the signal core. Layers of signal core are built up sequentially on both sides of the power core by alternating between depositing conducting metal and flowing and solidifying a dielectric in place.

14 Claims, 4 Drawing Sheets

FIG. 2G,H

DOUBLE-SIDED HYBRID HIGH DENSITY CIRCUIT BOARD AND METHOD OF MAKING SAME

FIELD OF THE INVENTION

The present invention relates to a multilayer hybrid circuit board and, more particularly, a three-dimensional board having interconnect structures on either side of a central core layer, and a method of making the three-dimensional structure.

BACKGROUND OF THE INVENTION

In parallel with an increasing tendency toward the miniaturization of integrated circuits in the electronic industry, there has been an increasing trend aimed at the production of circuit boards which permit high density mounting to take full advantage of the miniaturization of the devices. Also, there has been a tendency toward forming both a power supply circuit and signal circuits on a single board.

In the past, printed wiring boards have been used in which a plurality of double-sided copper clad boards each were formed with a printed wiring pattern on laminated foil copper by the subtractive process. These boards were laminated, and the necessary conductive passages from layer to layer provided by plated through holes. However, the boards' structures and the dielectric resins were typically made for low density applications.

A further difficulty with known methods of production for multilayer boards is that with the trend toward higher and higher densities although the board gets thicker, the size of the plated through holes gets smaller. The present technology requires hole diameters of under 0.005 inch. Drilling these holes is not possible with the current technology, and maintaining the tight tolerances on the size of the holes has reached the limits of machine capabilities. At present, the limit of conventional hole sizes is 0.015 inch, with a hole pad of 0.03 inch diameter. Thus, the problems to be addressed in fabrication of multilayer double-sided boards include keeping the finished board thin, maintaining small hole size for through holes, while avoiding the stresses created by the heat of pressure of lamination.

SUMMARY OF THE INVENTION

It is an objective of the present invention to overcome the foregoing deficiencies of the prior art in providing a multilayer circuit board in which the circuit paths and through holes or posts are high in reliability and provide very high density mounting.

More particularly, an objective of the present invention is to provide a method of fabricating double-sided boards which avoid the stresses created by known heat and pressure dependent lamination techniques. A related objective of the method is to obtain the through holes or conductive posts through the multilayer board achieve holes that are 0.003 inch or less in diameter.

In summary, the present invention comprises a highly efficient method for building a very fine line three-dimensional package without lamination during construction of the signal core. Construction of the signal core employs a method of line and hole formation and planarization without drilling, and avoids imposing excessive stress on the package during its assembly. In forming the three-dimensional structure, a power core which may comprise a single or multiple layers is manufactured in the conventional method using a very high dielectric constant material. The power core may comprise a single layer of a copper substrate, or may begin with a copper substrate and incorporate alternating layers of a nonconducting material of a very high dielectric constant and a conductive metal. These multiple layers are stacked and laminated under pressure and controlled temperatures. Interconnect holes are drilled in this multilayer package and the holes are plated with copper to interconnect the various conducting layers according to known technology.

A signal core is then constructed on both sides of the power core, using a sequential approach with a low dielectric constant material. The method comprises utilizing photoresist techniques to define the regions of horizontal lines running parallel to the surface of the power core substrate and vertical posts running perpendicular to the surface of the core, as each layer of lines and posts is established. After metallization of the posts and lines, the dielectric is flowed over the pattern of lines and posts to form a finished layer of the signal core. The sequence is repeated as many times as necessary to build up the required wiring pattern in the signal core. Layers of signal core are built up sequentially on both sides of the power core by alternating between depositing conducting metal and flowing and solidifying a dielectric in place.

In this way, a very thin, double-sided board is created without imposing undue stress on the board. Depositing signal core layers on both sides of the power core equalizes and balances the stresses on the central core or substrate. The method described and claimed has very tight dimensional controls. The present method simplifies the making of multilayer hybrid circuit boards, and provides a new and unique circuit board with greatly-increased capacity at reduced cost.

The boards described and claimed herein and the method of manufacture can be used by the printed wiring board industry, the integrated circuit industry, the hybrid circuit industry, and processes using a combination of these.

No lamination of the signal core or the drilling of fine holes is required to achieve the complete, finished, double-layer package, so that the likelihood of damage to any board during manufacture is minimized.

The above and other objects of the present invention, and the features and advantages thereof will become more apparent from the following detailed description taking in conjunction with the drawings.

BRIEF DESCRIPTION OF THE DRAWINGS

FIGS. 2A-2K is a series of sectional views for explaining the method for producing the very high density multilayer board of the present invention.

DETAILED DESCRIPTION OF A PREFERRED EMBODIMENT

Figure 1A:
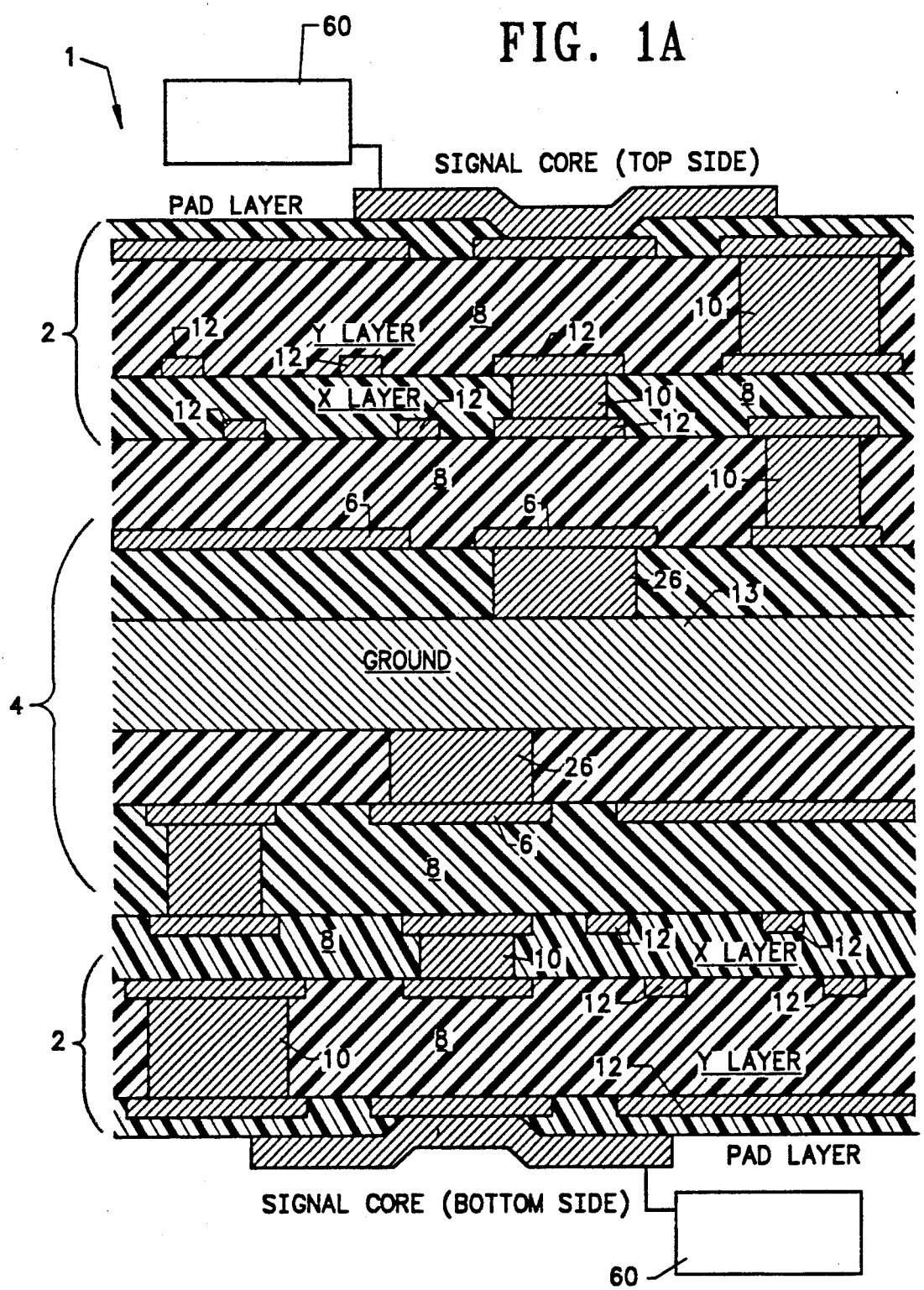
FIG. 1A is a sectional expanded view of a very high density, multilayer board formed in accordance with the present invention and incorporating a power core formed as shown in FIG. 1B.

A description of the present invention will now be given with respect to FIG. 1, which is an enlarged vertical sectional view of a finished double-sided package as generally indicated by the reference numeral 1. In composing the double-sided package, signal cores generally indicated at 2 are built up sequentially on both sides of a power core 4 by depositing several layers alternating between a conducting metal 6 generally indicated by the hatch regions, and a dielectric 8 generally represented by the opposingly hatched regions. The metal lines 6 need to be connected through the dielectric material 8 to form electrically conductive paths to complete each signal core. Therefore, connecting paths perpendicular to the surface of power core 4 are formed in the dielectric 8 by defining posts 10 of an electrical conductor (e.g., copper) on the metal lines 12 before applying the dielectric layer 8 (by a process to be explained with reference to FIG. 2). The metal lines 12 are formed one layer at a time, and patterned using photomasking techniques.

Figure 1B:
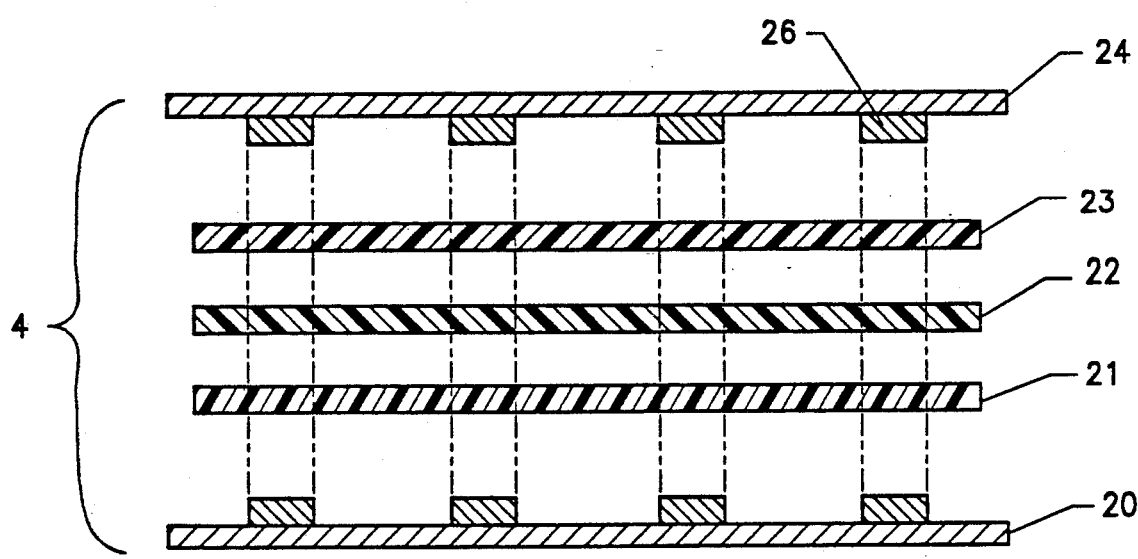

As illustrated in FIG. 1A, the power core may comprise a single ground layer comprising a copper sheet 13. Alternatively, the basic structure of the power core layer 4 may comprise a conventional printed wiring board built by conventional processing as illustrated with respect to FIG. 1B. As shown in FIG. 1B, the power core 4 may be constructed with a built-in capacitance layer formed between the metal surfaces 24 and 20 to provide metal dielectric interconnects on a metal substrate. The process is typically started with a layer 20 of a conducting material such as copper with a pre-etched pattern. Alternating layers of non-conducting materials 21, 23, and patterned conducting material 22, are applied to provide a very high dielectric constant (between 30 and 60) material such as titanium oxide. The layers 21, 22, and 23 are interposed and stacked up, and topped by a further patterned metallic layer 24. The multiple layers 20–24 are laminated at high pressure under controlled pressure. Holes are then drilled at locations 26 as indicated by the lands defined on the copper layers. These holes are plated with copper to interconnect the various conducting layers, to provide the completed power core 4. Returning to FIG. 1A, the metal lines found as part of the printed circuit board may carry voltages $V_1$ and $V_2$; the through holes 26 to ground are also shown. This finished board provides the substrate for supporting the signal cores 2 to be formed sequentially on either side thereof. This balanced processing equalizes stresses on the substrate and the finished, double-sided board, avoiding warping and other damage.

Turning next to FIG. 2, the complete process for building each signal core of the double-sided package is shown in FIGS. 2A–2K and begins with the completed power core or substrate 4. First a thin insulating layer 30 of the dielectric is applied to the surface by printing, roller coating, spin coating, spray coating, or the like, method. It is important to note that this dielectric is generally flowed into place, and hardened on the surface of the core 4 rather than laminated. The general approach of this process is to avoid any form of lamination, as it inevitably results in greater thicknesses, the use of undesirable heat and pressure treatment steps, and variations in thickness of the deposited layers.

After curing of the dielectric 30, a seed layer 32 of copper or other conductive metal is deposited using sputtering or autocatalytic process. This seed layer over the dielectric is to form the electrical connections which are to be further defined by the photoresist and exposure steps which follow below. The seed layer forms the base for the lines running parallel to the surface of the power core or substrate 4.

Figure 2A:
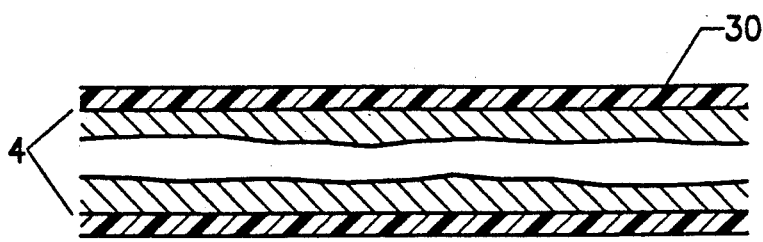
Figure 2B:
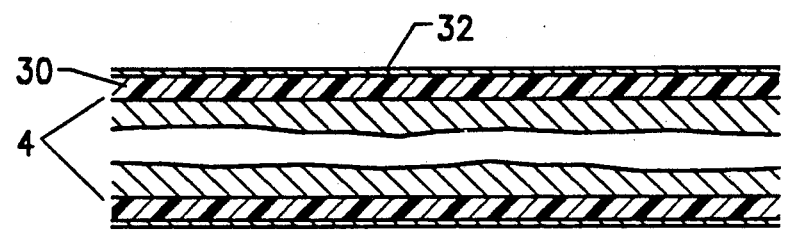
Figure 2C:
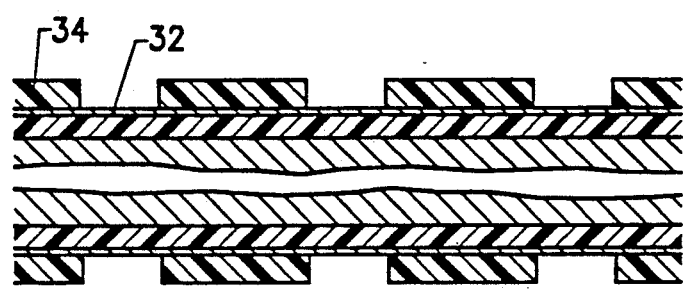

Referring next to FIG. 2C, a photoresist 34 is applied on the seed layer 32, and exposed and developed to define the pattern of the lines running over the surface of the substrate. It is this step which will define the pattern for the metal lines which are then deposited in the step shown in FIG. 2D to partially establish one level of a complete signal core.

Figure 2D:
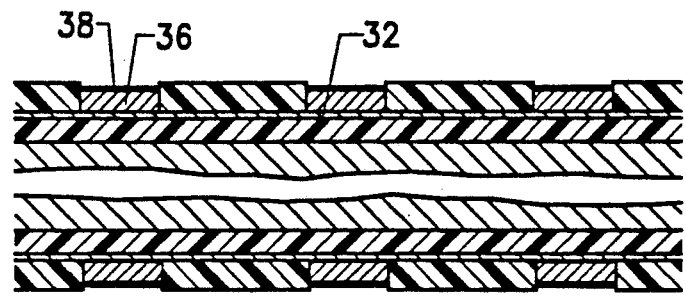

Referring to FIG. 2D, a conductive material such as copper 36 is electroplated on the seed layer 32 to the desired thickness and configuration of the conductive lines for the signal core. To maximize the electrical conductivity and ability to form connections of these lines to the posts 10 to be defined in the steps below, a flash of chromium or nickel 38 is now deposited on top of the copper 36.

Figure 2E:
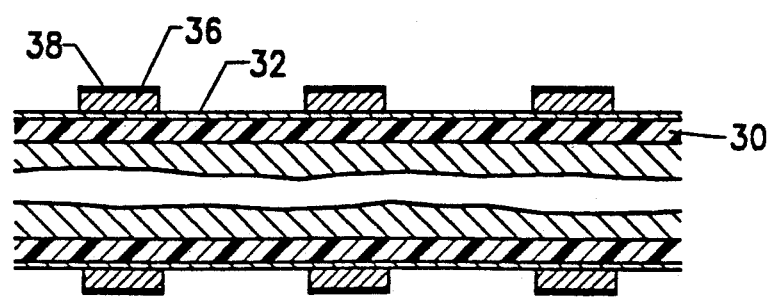

Photoresist 34 is now stripped away, as shown in FIG. 2E, leaving the lines 36 topped by the nickel flash 38 standing on the copper seed layer 32 and dielectric 30.

Figure 2F:
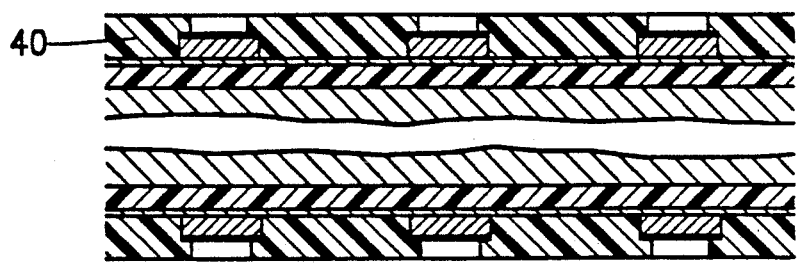

Referring next to FIG. 2F, a second layer of photoresist 40 is now applied, exposed and developed to give the pattern for the posts which will form the connections perpendicular to the power core from the core to each layer of signal lines and between the signal lines, as well as from the top layer of signal line to the pad layer shown in FIG. 1A.

Referring next to FIGS. 2G and 2H, the chromium or nickel flash is now chemically etched from the exposed areas on the previously-defined lines 36, and copper is electroplated through the openings 42 in the photoresist layer 40 to define the perpendicular connecting posts. These posts, 44, are topped with a flash of chromium or nickel 46.

Figure 2J:
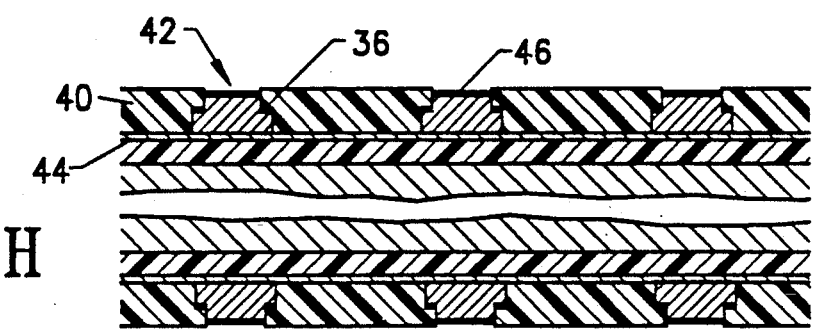
Figure 2J:
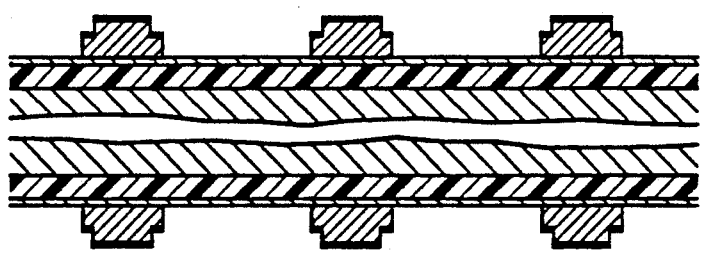
Figure 2K:
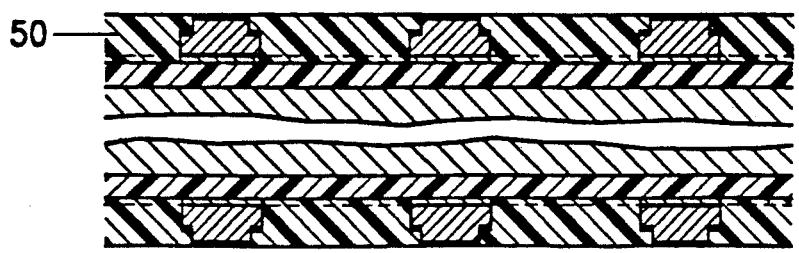

As shown in FIG. 2J, the second layer of photoresist 40 is now stripped from the surface defined by seed layer 32. The seed layer 32 is subjected to a wet etch to remove all of the seed layer 32 not protected from the wet etch by the presence of metal lines and/or posts. Therefore, the posts and lines are now sitting directly on the dielectric layer 30 previously flowed into place and solidified. Now the dielectric layer which will insulate adjacent posts and lines as previously formed is flowed into place by printing roller coatings, spin coatings, spray coating or the like method. The thickness should be greater than the height of the posts from the base plane so as to cover the posts. This dielectric 50 is solidified, and planarized as shown in FIG. 2K to be flush with the top of the posts 40. This can be done by lapping, laser etching, plasma etching, or any other of the known methods.

As desired, additional signal cores comprising layers of lines and posts may then be put in place and insulated from the other lines and posts by flowing a further layer of dielectric over the defined lines and posts using steps as shown in FIGS. 2B–2K.

The completed structure of the very high density multilayer fine-lined package consists of the ground plane or core 4, the V1 and V2 layers for the power core, and the X and Y layers for the signal core. As shown in FIG. 1A, a pad layer is provided on the outside for making contact with the remainder of the circuitry as exemplified by the component 60.

This invention will improve the propagation delays inherent in the present printed wiring boards and other interconnection schemes used to join electrical components to a useful electronic system. The process eliminates the conventional drilling and plating of holes in building the multilayers of metal/dielectric interconnect for the signal core.

The signal core can be deposited on both sides of the power core simultaneously. The two signal cores can have identical circuit desing or independent configuration depending on the needs of the package. The dual construction reduces the space requirements, and at the same time lowers the manufacturing costs for the package.

The formation of signal cores on both sides of the power core using a complementary process on both sides reduces stresses and the likelihood of warpage in formation of the three-dimensional circuit package.

Electronic components can now be installed on both sides of the integrated circuit package giving it the desirable three-dimensional construction.

By avoiding the drilling and through hole plating, holes can be made much smaller. Smaller holes need less wasted space, and higher circuit density in a much more compact circuit layout. This results in better performance of the product and less occupied space.

Further, by using a low dielectric constant material, the propagation delay is markedly improved. The use of the flowable dielectric material results in a significant improvement of the process sequence, and a departure from previously known process sequences, so that much smaller through hole sizes can be achieved.

The dielectric materials which can be used for this process include phenolic resin, epoxy, FR10, polyamide imide, polyimide, fluorinated ethylene propylene, and tetra-fluoroethylene, which will all give the high quality performance necessary for this type of structure.

Other alternatives to the present invention may become apparent to a person of skill in the art who studies the present invention disclosure. Therefore, the scope of the present invention is to be limited only by the following claims.

What is claimed is:

1. A method of making a multilayer circuit board including a power core and signal cores carried on both major surfaces of said power core, said method of making said circuit board including the steps of:
   applying a layer of a nonconducting material of a high dielectric constant on both major surfaces of a copper substrate and, thereafter, alternating between layers of a patterned metal and layers of said nonconducting material, one of said patterned metal layers being the outermost layer applied to said copper substrate;
   laminating said nonconducting material layers and said patterned metal layers on said copper substrate at high pressure and under controlled temperature to form a multilayered printed circuit board as said power core;
   drilling through holes in said power core to permit electrical communication between said layers of patterned metal; and
   forming said signal cores on said major surfaces of said power core by,
   (a) depositing first set of conductive posts on selected locations of said outermost layers of said power core for electronic communication between said power core and said signal cores, said conductive posts extending vertically away from said layers of power core,
   (b) coating said outermost surfaces of said power core with a layer of a low dielectric constant material to insulate said first sets of conductive posts,
   (c) depositing a layer of one or more conductive lines parallel to said outermost layers of said power core on either side of said power core, said layers of one or more conductive lines electronically communicating with said first set of conductive posts in selected locations,
   (d) depositing second sets of conductive posts on selected locations of each of said one or more conductive lines, said second sets of conductive posts electronically communicating with and extending vertically away from said one or more conductive lines,
   (e) applying a second layer of said low dielectric constant material over said layers of one or more conductive lines and said second sets of conductive posts to electrically isolate adjacent portions of said one or more conductive lines and said second sets of conductive posts, and
   (f) repeating steps c through e to define additional layers of conductive lines interconnected by conductive posts and separated by said low dielectric constant material to form said multilayer circuit board, said multilayer circuit board permitting electronic communication between said signal cores carried on said major surfaces of said power core.

2. A method as claimed in claim 1 wherein said step of depositing a first set of conductive posts, said step of depositing a layer of one or more conductive lines, and said step of depositing a second set of conductive posts includes using copper lines and posts.

3. A method as claimed in claim 1 wherein said step of applying a layer of a nonconducting material of a high dielectric constant includes using a material with a dielectric constant between 30 and 60.

4. A method as claimed in claim 1 wherein said coating step and said step of applying a second layer of said low dielectric constant material includes choosing a material from the group comprising phenolic resin, epoxy, polyimide, fluorinated ethylene propylene, and tetra-fluoroethylene.

5. A method as claimed in claim 1 and including the additional step of depositing a seed layer of highly conductive material over each of said layers of low dielectric constant material prior to said step of depositing a layer of one or more conductive lines.

6. A method as claimed in claim 5 wherein said step of depositing a layer of one or more conductive lines includes applying, exposing and developing a layer of photoresist over said seed layer to establish the locations and patterns of said one or more conductive lines.

7. A method as claimed in claim 6 wherein said step of depositing a layer of one or more conductive lines includes forming a first patterned layer of photoresist over said seed layer, laying down said one or more conductive lines in openings defined by said photoresist pattern, removing said first patterned layer of photoresist.

8. A method as claimed in claim 7 wherein said step of depositing a second set of conductive posts includes, after removing said first patterned layer of photoresist, forming a second layer of photoresist having openings for said conductive posts aligned with portions of said one or more conductive lines, depositing said conductive posts in said openings, and thereafter removing said second layer of photoresist and said seed layer.

9. A method as claimed in claim 8 wherein said step of depositing a first set of conductive posts, said step of depositing a layer of one or more conductive lines, and said step of depositing a second step of conductive posts includes the step of depositing a flash of chromium or nickle atop said conductive posts and said one or more conductive lines prior to removing said photoresist.

10. A method as claimed in claim 7 wherein said step of applying a second layer of low dielectric constant material includes the step of planarizing said second layer of low dielectric constant material flush with the top of said conductive posts, so that further layers of conductive lines and posts may be deposited.

11. A method as claimed in claim 10 wherein said step of applying a second layer of low dielectric material includes the step of originally depositing said layer of low dielectric constant material to a greater thickness that the height of said conductive posts, whereafter said planarizing step is accomplished.

12. A double-sided high density multilayer fine line circuit board comprising a power core layer including at least a highly conductive ground plane and a signal core formed on each side of said power core layer, each said signal core including patterned layers of conductive lines extending horizontally over and parallel to said ground plane and electrically communicating with said ground plane through conductive posts extending vertically above and perpendicular to said ground plane, said conductive posts overlying portions of said conductive lines and extending vertically between said patterned layers of conductive lines or to a surface of said signal core, said conductive lines and posts being electrically isolated by a flowable nonconducting material of a relatively low dielectric constant flowed into place over said conductive lines and posts, then solidified, whereby said conductive lines and posts are electrically isolated, said conductive posts being 0.003 inch or less in diameter.

13. A circuit board as claimed in claim 12 wherein said signal cores are simultaneously deposited on both sides of said power core layer, whereby a three dimensional circuit board is achieved without warpage.

14. A circuit board as claimed in claim 13 wherein said low dielectric constant material is chosen from the group comprising phenolic resin, epoxy, polyimide, fluorinated ethylene propylene, and tetra-fluoroethylene.

* * * * *